United States Patent [19]
Yamamoto et al.

[11] Patent Number: 5,818,278
[45] Date of Patent: Oct. 6, 1998

[54] LEVEL SHIFT CIRCUIT

[75] Inventors: Kazuya Yamamoto; Kousei Maemura, both of Tokyo, Japan

[73] Assignee: Mitsubishi Denki Kabushiki Kaisha, Tokyo, Japan

[21] Appl. No.: 805,883

[22] Filed: Mar. 3, 1997

[30] Foreign Application Priority Data

Sep. 6, 1996 [JP] Japan ..................... 8-236429

[51] Int. Cl.⁶ ............................................. H03K 19/07
[52] U.S. Cl. ........................... 327/333; 327/331; 326/63; 326/68
[58] Field of Search .................... 327/333, 331, 327/306; 326/63, 69, 80, 68, 81, 83

[56] References Cited

U.S. PATENT DOCUMENTS 5,128,556  7/1992  Hirakata ..................... 327/541
5,304,870  4/1994  Nagasawa .................... 327/333

FOREIGN PATENT DOCUMENTS 537356  2/1993  Japan .

Primary Examiner—Timothy P. Callahan
Assistant Examiner—T. T. Lam
Attorney, Agent, or Firm—Leydig, Voit & Mayer, Ltd.

[57] ABSTRACT

A level shift circuit shifting logic levels of an SCFL circuit to logic levels of a DCFL circuit, including an SCFL circuit having complementary outputs; two source follower circuits with their inputs respectively connected to the complementary outputs of the SCFL circuit; a high/low detecting circuit detecting "high" or "low" signals which have DCFL levels from the two source follower circuits and outputting signals having logic levels according to the detection results; and DCFL circuits with inputs connected to outputs of the high/low detecting circuit. Therefore, it is possible to obtain a level shift circuit operating with a wider voltage range and in a wider temperature range than the prior art circuit.

6 Claims, 7 Drawing Sheets

LEVEL SHIFT CIRCUIT

FIELD OF THE INVENTION

This invention relates to a level shift circuit, more particularly, to a level shift circuit which serves a GaAs digital circuit or the like and shifts signals at SCFL level into signals at DCFL level.

BACKGROUND OF THE INVENTION

Figure 7:
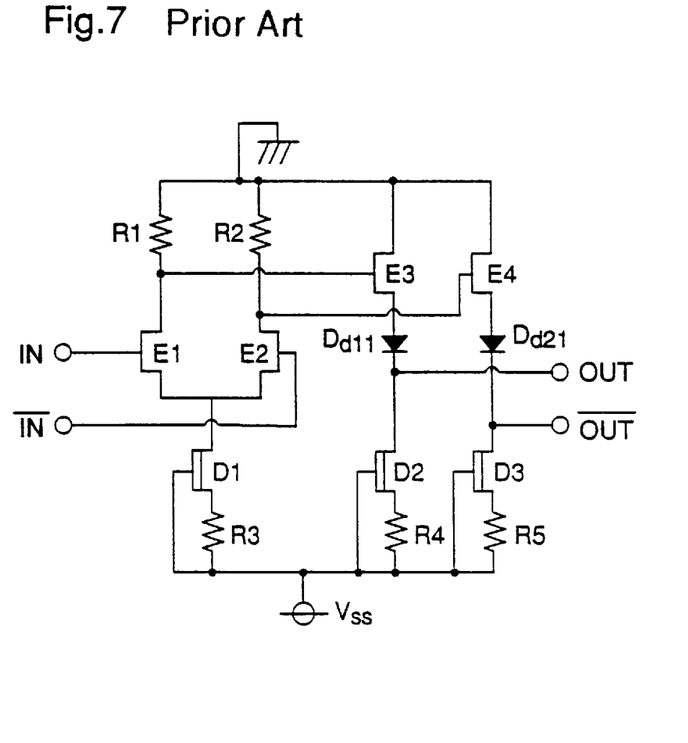
FIG. 7 shows an example of a SCFL circuit.
Figure 8:
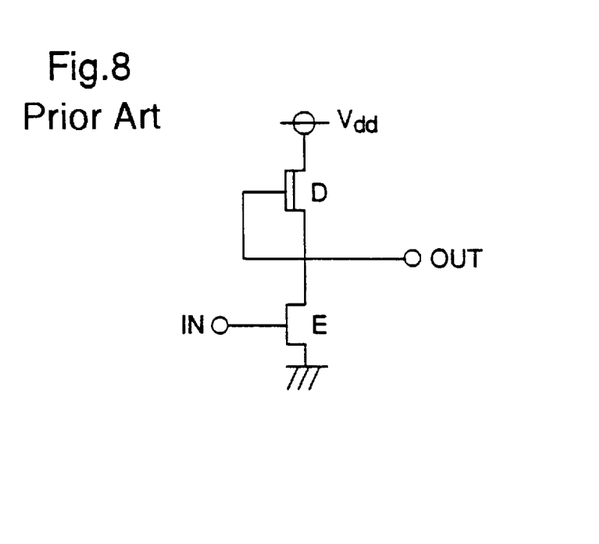
FIG. 8 shows an example of a DCFL circuit.

GaAs digital circuits are used as transmitter-receivers in optical communication systems and high-speed IC testers. The basic configurations of the GaAs digital circuit are of two major types: SCFL (Source-Coupled FET Logic) as shown in FIG. 7, and DCFL (Direct-Coupled FET Logic) as shown in FIG. 8. Generally, SCFL circuits are used for circuits requiring high-speed operation, and DCFL circuits are used for circuits requiring low power dissipation operation and high integration density.

In the SCFL in FIG. 7, E1 to E4 designate E-FETs (Enhancement mode FET), D1 to D3 designate D-FETs (Depletion mode FET), R1 to R5 designate resistors, Dd11 and Dd21 designate diodes, IN and $\overline{\text{IN}}$ designate input signal terminals, OUT and $\overline{\text{OUT}}$ designate output signal terminals, and Vss designates a supply voltage terminal.

In the E-FETs E1 and E2, the input signal terminals IN and $\overline{\text{IN}}$ are connected to the respective gates, the drains are connected through the resistors R1 and R2 to a ground, and the sources are commonly connected to each other. This common source is connected through the D-FET D1 and the resistor R3 to the supply voltage terminal Vss. The gate of the D-FET D1 is connected to the supply voltage terminal Vss.

In the E-FET E3, the gate is connected to a connection node between the E-FET E1 and the resistor R1, the drain is connected to the ground, and the source is connected through the diode Dd11, the D-FET D2, and the resistor R4 to the supply voltage terminal Vss. In the E-FET E4, the gate is connected to a connection node between the E-FET E2 and the resistor R2, the drain is connected to the ground, and the source is connected through the diode Dd21, the D-FET D3, and the resistor R5 to the supply voltage terminal Vss. To the common connection node between the diode Dd11 and the D-FET D2, and the common connection node between the diode Dd21 and the D-FET D3, the output signal terminals OUT and $\overline{\text{OUT}}$ are connected, respectively. To the respective gates of the D-FETs D2 and D3, the supply voltage terminal Vss is connected.

Next, a description is given of the operation. Signals are input to the input signal terminals IN and $\overline{\text{IN}}$ in a complementary manner, and in accordance with the input signals, one of the E-FETs E1 and E2 constituting a differential amplifier is turned on and the other is turned off, thereby switching current paths, so that a current to be sunk into a current source comprising the D-FET D1 and the resistor R3, flows through one of the E-FET E1 and the E-FET E2.

The current flow across one of the resistors R1 and R2, a voltage drop, and the E-FETs E3 and E4 constituting a source follower together become a logic level of "L" for a voltage drop or of "H" for no voltage drop. As a result, the output signal terminals OUT and $\overline{\text{OUT}}$ output signals having reverse phases to those of the input signals at the input signal terminals IN and $\overline{\text{IN}}$, in the complementary manner.

In the DCFL shown in FIG. 8, reference character E designates an E-FET, D designates a D-FET, IN designates an input signal terminal, OUT designates an output signal terminal, and Vdd designates a supply voltage terminal.

In the E-FET E, the gate is connected to the input signal terminal IN and the source is grounded. In the D-FET D, and the drain is connected to the supply voltage terminal Vdd, the gate and the source are connected to the drain of the E-FET E, and the output signal terminal OUT, respectively.

Next, a description is given of the operation.

When an "H" signal is input to the input signal terminal IN, the E-FET E is turned on. This leads to a conduction between the output signal terminal OUT and the ground, whereby the output signal terminal OUT becomes "L" level.

On the contrary, when a "L" signal is input to the input signal terminal IN, the E-FET E is turned off. This allows a current to flow into the output signal terminal OUT through the D-FET D, whereby the output signal terminal OUT becomes "H" level.

Thus, the SCFL circuit and the DCFL circuit both invert the logic level of the input and output the inverted logic level. However, the SCFL circuit is in contrast to the DCFL circuit in their advantages and disadvantages. While the SCFL circuit can operate at a high speed, it has a large power consumption due to its current flow all the time. While the DCFL circuits is advantageous in its power consumption and high integration density, it is not appropriate for high-speed operation. In this way, advantages and disadvantages are in contrast to each other for the SCFL circuit and the DCFL circuit.

Therefore, in order to realize a GaAs digital circuit having high-speed operation and low power consumption, it is appropriate to make a circuit portion requiring high-speed operation of an SCFL circuit and a circuit portion requiring low power consumption of a DCFL circuit. In this case, it is necessary to make a connection between the SCFL circuit and the DCFL circuit for exchanging signals between the both circuits.

For a connection between an SCFL circuit and a DCFL circuit, however, it is necessary to precisely convert their logic levels ("H" level and "L" level) from SCFL level (0 V and −1 V, or Vdd and Vdd −1 V) to DCFL level (0.6 V and 0 V or Vss+0.6 V and Vss). Here it is assumed that the Vdd is a positive supply voltage (for example, +2 V and +5.2 V), and the Vss is a negative supply voltage (for example, −2 V and −5.2 V), and that the Vss is 0 V when a positive supply voltage is used as the Vdd, and the Vdd is 0 V when a negative supply voltage is used as the Vss.

Figure 9:
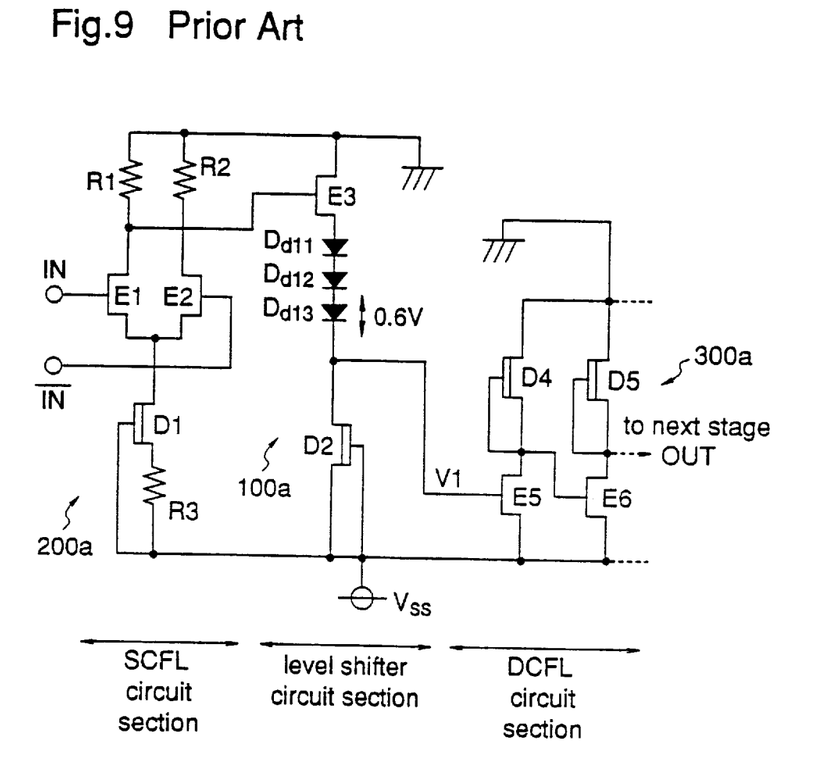
FIG. 9 shows an example of a prior art SCFL-DCFL level shift circuit.

FIG. 9 shows a prior art level shift circuit for converting the SCFL level signals into the DCFL level signals. In the figure, E1 to E3, E5, and E6 designate E-FETs, D1, D2, D4, and D5 designate D-FETS, R1 to R3 designate resistors, Dd11 to Dd13 designate diodes, IN and $\overline{\text{IN}}$ designate input signal terminals, and OUT designates a DCFL level output signal terminal connected to a next stage. Vss designates a supply voltage terminal and is assumed to be about −3 V here. V1 designates an input voltage from a level shifter circuit section to a DCFL circuit section.

In the E-FETs E1 and E2, the input signal terminals $\overline{\text{IN}}$ and IN are connected to the respective gates, the drains are connected through the resistors R1 and R2 to a ground, and the sources are both connected to a common connection node. This common source is connected through the D-FET D1 and the resistor R3 to the supply voltage terminal Vss. The supply voltage terminal VSS is connected to the gate of the D-FET D1. These E-FETs E1 and E2, the D-FET D1, and the resistors R1, R2, R3 constitute a SCFL circuit section 200a.

In the E-FET E3, the gate is connected to a connection node between the E-FET E1 and the resistor R1, the drain is connected to the ground, and the source is connected through the diodes Dd11 to Dd13 and the D-FET D2 to the supply voltage terminal Vss. The gate of the D-FET D2 is connected to the supply voltage terminal Vss. The E-FET E3, diodes Dd11 to Dd13, and D-FET D2 constitute a level shifter circuit section 100a.

In the E-FET E5, the gate is connected to a connection node between the diode Dd13 and the D-FET D2, and the source is connected to the supply voltage terminal Vss. In the D-FET D4, the gate and drain are connected to the drain of the E-FET E5, and the source is connected to a ground. In the E-FET E6, the gate is connected to a connection node between the D-FET D4 and the E-FET E5, the source is connected to the supply voltage terminal Vss. In the D-FET D5, the gate and source are connected to the drain of the E-FET E6, and the drain is connected to the ground. The D-FET D4, E-FET E5, D-FET D5, and E-FET E6 constitute a DCFL circuit section 300a and a connection node between the drain of the E-FET E6 and the gate and source of the D-FET D5 is the output signal terminal OUT, from which signals are output to a next stage DCFL circuit.

Next, operation will be described taking as an instance a case where Vss=−3 V. In accordance with SCFL level input signals which are input to the input signal terminals IN and $\overline{\text{IN}}$ in the complementary manner, one of the E-FETs E1 and E2 is turned on and the other E-FET is turned off. For example, when a signal of about −1.4 V and a signal of about −0.8 V, that is, a "L" level signal and a "H" level signal, are input to the input signal terminals IN and $\overline{\text{IN}}$, the E-FET E1 is then turned off and the E-FET E2 is turned on, and no voltage drop occurs across the resistor R1. Therefore, the source potential of the E-FET E3 of the level shifter circuit section 100a becomes "H", and a voltage drop of about 2.4 V occurs due to the diodes Dd11 to Dd13. The voltage drop is equal to the sum of the gate-source voltage of the E-FET E3 (for example, about 0.6 V) and the forward voltage is identical to the total voltages of these three diodes (the forward voltage per diode is about 0.6 V).

Due to this voltage drop, the input voltage V1 of the DCFL circuit section 300a is reduced to about −2.4 V, that is, to "H" at the DCFL level. As a result, the E-FET E5 is turned on and a "L" level is input to the gate of the E-FET E6. This causes the E-FET E6 to be turned off, and an "H" at the DCFL level is output from the output terminal OUT.

On the contrary, when "H" level and "L" level signals are input to the input signal terminals IN and $\overline{\text{IN}}$ of the SCFL circuit section 200a, respectively, the E-FET E1 is then turned on and the E-FET E2 is turned off, and a voltage drop occurs across the resistor R1. Therefore, the source potential at the E-FET E3 of the level shifter circuit section 100a becomes "L" and the input voltage V1 of the DCFL circuit section 300a is reduced to about −3.0 V, that is, "L" at the DCFL level. As a result, the E-FET E5 is turned off and an "H" level is input to the gate of the E-FET E6. This turns on the E-FET E6, and an "L" at the DCFL level is output from the output terminal OUT.

Thus, in the prior art level shift circuit, so as to convert signals at the SCFL level into those at the DCFL level, a DC level shift amount of about 1.8 V(=0.6 V×3) is obtained by means of the diodes Dd1 to Dd3 of the level shifter circuit section. Since the forward voltages of the respective diodes have been nearly determined, circuit designing as well as setting of circuit constants can be easily carried out.

Figure 2:
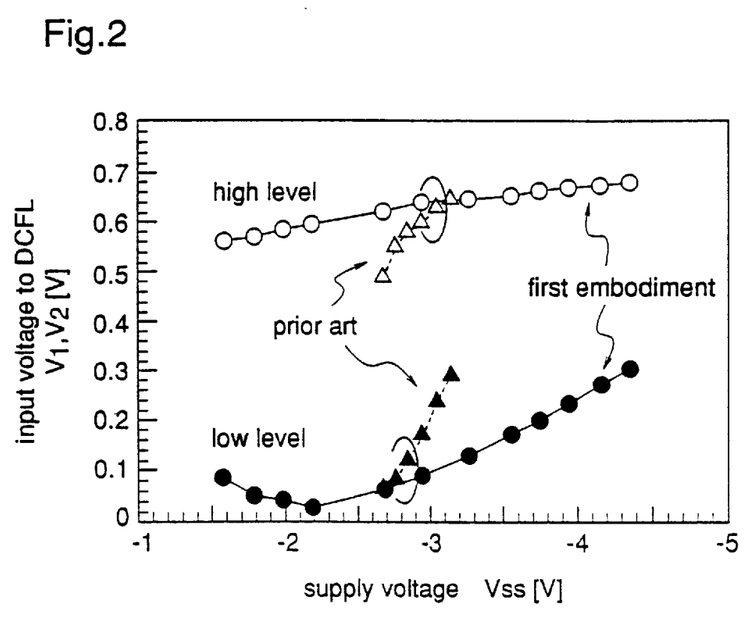
FIG. 2 shows an example of results of simulations exhibiting an operating voltage range in the first embodiment of the present invention.

In this prior art circuit, however, the ground is the potential reference in the SCFL circuit section whereas the supply voltage Vss is the potential reference in the DCFL circuit section. Therefore, when the supply voltage Vss varies, the reference potential in the DCFL circuit section and the reference potential in the SCFL circuit section vary in directions opposite to each other with a change in the supply voltage Vss, thereby varying "H" and "L" levels of the voltage V1 to be input to the DCFL circuit in accordance with a change in the supply voltage Vss. The lines representing a operating voltage range of the prior art circuit in FIG. 2, a graph, show this state. Hence, when a variation in the supply voltage of more than about 0.6 V occurs, for instance, when the supply voltage Vss varies from −3.2 V to −2.7 V as shown in FIG. 2, the level shift circuit cannot provide a normal operation.

As described above, the prior art SCFL-DCFL level shift circuit has a narrow operating range of about 0.6 V with respect to the supply voltage variation. However, a range of variation in supply voltage which ensures normal operation of the circuit is generally defined to be ±5% or ±10% with respect to center voltage. Thus, the circuit is not suited for application to battery drivers such as a portable phone which have a wide range of supply voltage variation.

SUMMARY OF THE INVENTION

The object of the present invention is to provide a level shift circuit which can operate normally even when a the supply voltage varies in a wide range and assures an operation in a wide temperature range.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from the detailed description.

According to a first aspect of the present invention, a level shift circuit shifting logic levels of SCFL circuit to logic levels of DCFL circuit, comprises: a SCFL circuit having complementary outputs; two source follower circuits with their inputs respectively connected to the complementary outputs of the SCFL circuit; a high/low detecting circuit detecting the "high" or "low" of the signals which have become the DCFL level by the two source follower circuits and outputting signals having logic levels according to the detection results; and DCFL circuits with their inputs connected to the respective outputs of the high/low detecting circuit. By this construction, it is possible to obtain a level shift circuit operating with a wider supply voltage range than the prior art circuit, as well as in an extended temperature range.

According to a second aspect of the present invention, in the level shift circuit of the first aspect, a flip-flop circuit is employed as the high/low detecting circuit. Therefore, it is possible to realize a level shift circuit operating with a wider supply voltage range than the prior art circuit, as well as in an extended temperature range, by using a flip-flop circuit which is widely used.

According to a third aspect of the present invention, a circuit shifting logic levels of SCFL circuit to logic levels of SCFL circuit, comprises: a SCFL circuit having complementary outputs; a DCFL type flip-flop circuit including two series circuits each having a switching FET and a load resistor, two parallel circuits each having a resistor and a capacitance, two input/output nodes connected to respective connection nodes between the switching FETs and the load resistors in the series circuits, where the input/output nodes are cross-coupled to the gates of the switching FETs of the series circuits through the parallel circuits, respectively; two source follower circuits each having a FET and a diode where their inputs are respectively connected to the complementary outputs of the SCFL circuit and their outputs are connected to the respective ends of the two load resistors whose other ends are connected to the switching FETs; and two DCFL circuits having inputs respectively connected to the input/output nodes of the flip-flop circuit and at least an output connected to a next stage DCFL circuit. Therefore, it is possible to obtain a level shift circuit operating with a supply voltage range more than four times as wide as that of the prior art circuit, as well as in an extended temperature range.

According to a fourth aspect of the present invention, in the level shift circuit of the third aspect, the respective capacitances are removed from the two parallel circuits. Therefore, it is possible to obtain a level shift circuit operating with a wide supply voltage range more than four times as wide as that of the prior art circuit, as well as in an extended temperature range, and having a reduced chip area, corresponding to the removed capacitances, when actually patterned as an IC.

According to a fifth aspect of the present invention, in the level shift circuit of the third aspect, the respective load resistors are removed from the two series circuits. Therefore, it is possible to obtain a level shift circuit operating with a little wider supply voltage range than the prior art circuit, as well as in an extended temperature range, and having a reduced chip area, corresponding to the removed resistors, when actually patterned as an IC.

According to a sixth aspect of the present invention, in the level shift circuit of the third aspect, the respective diodes are removed from the two source follower circuits. Therefore, it is possible to obtain a level shift circuit operating with a supply voltage range more than four times as wide as that of the prior art circuit and in an extended temperature range, and being appropriate for operation at a low voltage range.

BRIEF DESCRIPTION OF THE PRESENT INVENTION

DETAILED DESCRIPTION OF THE PREFERRED EMBODIMENTS

[Embodiment 1]

Figure 1:
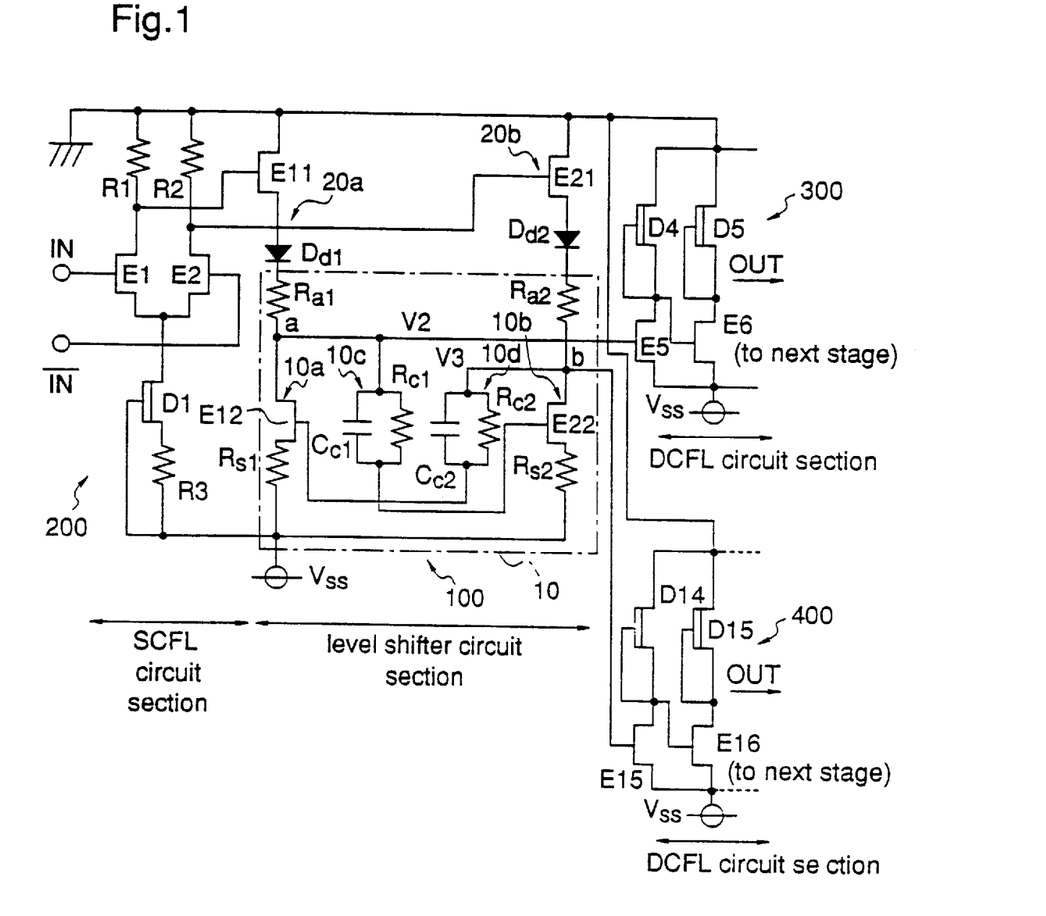
FIG. 1 illustrates an example of a level shift circuit according to a first embodiment of the present invention.

FIG. 1 is a diagram showing a a level shift circuit according to a first embodiment of the present invention. In the figure, E1, E2, E5, E6, E11, E12, E15, E16, E21, and E22 designate E-FETs, D1, D4, D5, D14, and D15 designate D-FETS, R1 to R3, Ra1, Ra2, Rs1, Rs2, Rc1, and Rc2 designate resistors, Dd1 and Dd2 designate diodes, Cc1 and Cc2 designate capacitances, IN and $\overline{\text{IN}}$ designate input signal terminals, OUT and $\overline{\text{OUT}}$ designate DCFL level output signal terminals. Vss designates a supply voltage terminal, and is assumed to be about −3 V in an example described for the first embodiment. V2 and V3 designate input voltages to a DCFL circuit.

In the E-FETs E1 and E2 of a SCFL circuit section 200, the input signal terminals IN and $\overline{\text{IN}}$ are connected to the respective gates, the drains are connected to a ground through the resistors R1 and R2, and the sources are commonly connected to each other. This common source is connected through the D-FET D1 and the resistor R3, and the supply signal terminal Vss is connected to the gate of the D-FET D1 to the supply voltage terminal Vss.

The source follower circuit 20a comprises the aforesaid E-FET E11 and diode Dd1, and the source follower circuit 20b comprises the aforesaid E-FET E21 and diode Dd2.

In the E-FET E11 of a level shifter circuit section 100, the gate is connected to a connection node between the E-FET E1 and the resistor R1, the drain is connected to the ground, and the source is connected through the diode Dd1, the load resistor Ra1, the E-FET (switching FET) E12, and the resistor Rs1 to the supply voltage terminal Vss. In the E-FET E21, the gate is connected to a connection node between the E-FET E2 and the resistor R2, the drain is connected to the ground, and the source is connected through the diode Dd2, the load resistor Ra2, the E-FET (switching FET) E22, and the resistor Rs2 to the supply voltage terminal Vss. The gate of the E-FET E12 is connected through a parallel circuit 10d comprising the resistor Rc2 and the capacitance Cc2 to a connection node (input/output node) b between the E-FET E22 and the resistor Ra2, the gate of the E-FET E22 is connected through a parallel circuit 10c comprising the resistor Rc1 and the capacitance Cc1 to a connection node (input/output node) a. What is shown within a dotted and dashed line is a DCFL type flip-flop circuit 10 disposed in the level shifter circuit section 100. The flip-flop circuit serves as a high/low detecting circuit which detects "high" or "low" of the signals which have become the DCFL level by means of the source follower circuits 20a and 20b and outputs signals having logic levels corresponding to the detection results.

In the E-FET E5 of a DCFL circuit section 300, the gate is connected to a connection node between the E-FET E12 and the resistor Ra1, and the source is connected to the supply voltage terminal Vss. In the D-FET D4, the drain is connected to the ground, and the source and gate are connected to the drain of the E-FET E5. In the E-FET E6, the gate is connected to a connection node between the D-FET D4 and the E-FET E5, and the source is connected to the supply voltage terminal Vss. In the D-FET D5, the drain is connected to the ground, and the source and gate are connected to the drain of the E-FET E6.

In the E-FET E15 of a DCFL circuit section 400, the gate is connected to a connection node between the E-FET E22 and the resistor Ra2, and the source is connected to the supply voltage terminal Vss. In the D-FET D14, the drain is connected to the ground, and the source and gate are connected to the drain of the E-FET E15. In the E-FET E16, the gate is connected to a connection node between the D-FET D14 and the E-FET E15, and the source is connected to the supply voltage terminal Vss. In the D-FET D15, the drain is connected to the ground, and the source and gate are connected to the drain of the E-FET E16.

Next, a description is given of operation. According to the complementary input signals at the SCFL level which are input to the input signal terminals IN and $\overline{\text{IN}}$ of the SCFL circuit section 200, one of the E-FETs E1 and E2 is turned on while the other is turned off. Then, a voltage drop occurs across the one of the resistors R1 and R2 connected to the E-FET which is turned on. As a result, signals which have reverse phases to those of the complementary signals which are input to the input signal terminals IN and $\overline{\text{IN}}$ are output to the level shifter circuit section 100.

For example, when "L" and "H" level signals are input to the input signal terminals IN and $\overline{\text{IN}}$ of the SCFL circuit section 200, respectively, the E-FET E1 is then turned off while the E-FET E2 is turned on, causing a voltage drop not across the resistor R1 but across the resistor R2. Therefore, "H" and "L" level signals at the SCFL level are output to the respective gates of the E-FETs E11 and E21 in the level shifter circuit section 100.

Hence, the source potentials of the E-FETs E11 and E21 become "H" and "L", respectively, and "H" and "L" level signals are input to the input/output nodes a and b of the flip-flop circuit 10, respectively.

In the flip-flop circuit 10, the E-FETs E12 and E22 of the circuit 10, are cross-coupled to each other through two parallel circuits, i.e., a parallel circuit 10c comprising the resistor Rc1 and the capacitance Cc1 and a parallel circuit 10d comprising the resistor Rc2 and the capacitance Cc2. Thus, this circuit 10 is realized using a minimum number of elements. In the parallel circuits 10c and 10d, the complementary voltage outputs of the flip-flop circuit 10 are effectively transferred to the E-FETs E12 and E22 serving as switching FETs, through the resistors Rc1 and Rc2 at a low frequency, and through the capacitances Cc1 and Cc2 at a high frequency. The resistors Rs1 and Rs2 are added at the source sides of the E-FETs E12 and E22, respectively, so that the E-FETs E12 and E22 can be switched completely off. Therefore, the flip-flop circuit 10 swiftly transits to states of "H" and "L", which are converted to the DCFL level due to the forward voltage drops across the diodes Dd1 and Dd2 and input to the input/output nodes a and b, and forcibly transfers the states of "H" and "L" to the DCFL circuit sections 300 and 400, respectively. In this level shift circuit, assuming that the SCFL circuit section 200 is directly connected to the DCFL circuits 300 and 400, respectively, it is difficult for each of the DCFL circuits to detect "H" and "L" of signals when a variation occurs in supply voltage. However, when these circuits are connected through a flip-flop circuit 10, because the flip-flop circuit 10 can rapidly transit to "high" or "low" even when signals whose levels are barely detectable as "H" or "L" are input, the "H" and "L" levels can be detected more swiftly compared to the case where the detection is carried out by the DCFL circuits 300 and 400 alone. Thus, the DCFL circuits 300 and 400 can make a swift level transition with the assistance of the flip-flop circuit 10. As a result, this level shift circuit can broaden its operation voltage range.

The above described operation is performed when the "H" and "L" level signals are input to the input signal terminals IN and $\overline{\text{IN}}$ of the SCFL circuit section 200, though its on-off operation and logic levels are opposite to those in the flip-flop circuit. Due to this, the supply voltage range of the level shift circuit when the variation in the supply voltage Vss occurs, extends from 0.6 V to more than about 1 V.

Moreover, the resistor Ra1 absorbs a potential difference between the gate voltage of the E-FET E5 serving as an input FET in the DCFL circuit section 300 and a cathode voltage of the diode Dd1, thereby preventing an increase of the voltage V2 which is input to the DCFL circuit section 300 due to an increase in the supply voltage Vss. The resistor Ra2 also absorbs a potential difference between the gate voltage of the E-FET E15 serving as an input FET in the DCFL circuit section 400 and a cathode voltage of the diode Dd2, thereby preventing an increase in the voltage V3 which is input to the DCFL circuit section 400 due to an increase in the supply voltage Vss. Therefore, the operating voltage range in this level shift circuit increases to about 2.7 V, as in a case where the supply voltage Vss varies, for example, in a range from −1.6 V to −4.4 V as shown in FIG. 2.

While a single diode is used for each of the diodes Dd1 and Dd2 in this embodiment, a series of diodes can be used instead when the supply voltage is high.

The DCFL circuit sections are connected to positive-phase and negative-phase sides of the complementary outputs in the level shifter circuit section, respectively, so that the loads of the level shifter circuit section become equal. Therefore, when a single phase signal is desired as in conventional DCFL circuits, one DCFL circuit is connected to one of the DCFL circuit sections in a subsequent stage, to receive the output.

On the other hand, when complementary output signals are obtained from these DCFL circuit sections, DCFL circuits are added as next stages to both of the DCFL circuit sections.

FIG. 2 shows a comparison between the operating voltage range of the prior art circuit shown in FIG. 9 and that of the level shift circuit of the first embodiment shown in FIG. 1, based on results of a simulation. The center voltage (optimal operating voltage) of the simulation is set 3 V. In the figure, the voltage levels ("H" and "L") of the voltage V1 in the circuit shown in FIG. 9 and those of the voltage V2 in the circuit shown in FIG. 1 are plotted. From the figure, it is found that in the prior art circuit, variation in V1 with respect to a variation in the supply voltage is large, and thus the operating voltage has a small range of −2.7 V to −3.2 V (about 0.6 V) while in the circuit of the first embodiment, variation in V2 with respect to a variation in the supply voltage is small, and thus a wide operating voltage range of −1.6 V to −4.2 V is obtained.

Figure 3:
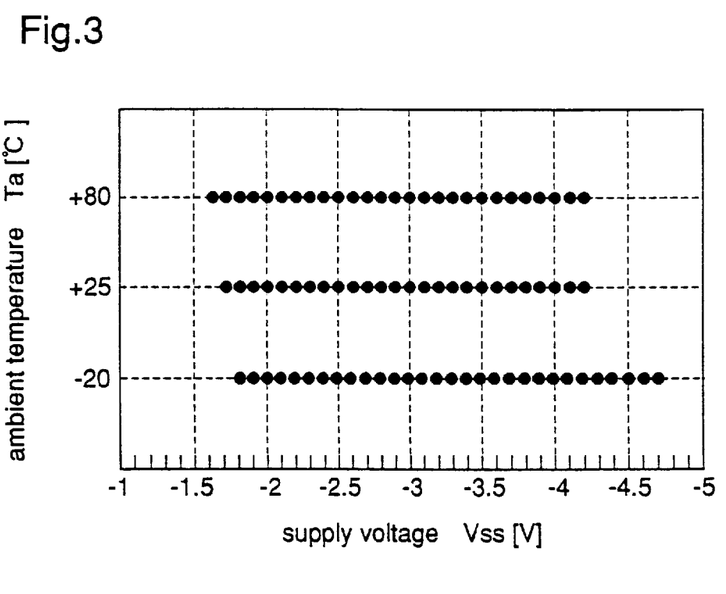
FIG. 3 shows an example of results of experiences on an operating voltage range versus a change in temperature in the first embodiment of the present invention.

FIG. 3 shows an experimental result of the operating voltage versus temperature characteristics of the first embodiment circuit. This circuit operates in the voltage range of −1.6 V to −4.2 V at an ordinary temperature of +25° C., and in a wide voltage range of −1.8 V to −4.2 V even at temperatures ranging from −20° C. to +80° C. This result shows that the level shift circuit of the first embodiment can operate in such an extended temperature range.

[Embodiment 2]

Figure 4:
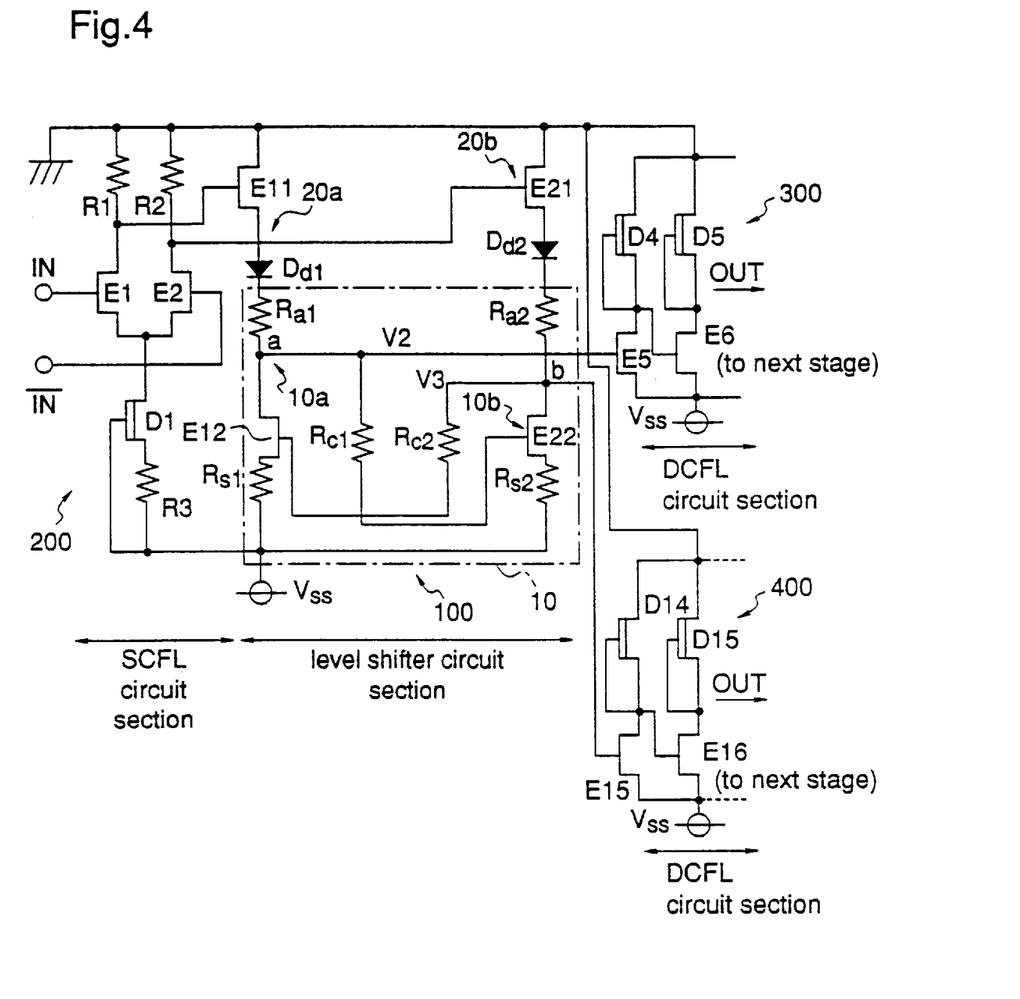
FIG. 4 illustrates an example of a level shift circuit according to a second embodiment of the present invention.

FIG. 4 is a diagram illustrating a level shift circuit according to a second embodiment of the present invention. This second embodiment circuit has a configuration of the circuit shown in FIG. 1, where the capacitances Cc1 and Cc2 are removed from the cross-coupled parallel circuits 10c and 10d, and the E-FETs E12 and E22 constituting the flip-flop circuit 10 are cross-coupled to each other through the resistors Rc1 and Rc2.

The circuit of the second embodiment, although its radio-frequency characteristic is inferior compared to that of the circuit shown in FIG. 1, can provide the same effects when the variation in supply voltage occurs as those of the circuit of the first embodiment. Moreover, when this circuit is actually patterned as an IC, its chip area can be reduced by an area corresponding to the removed capacitances Cc1 and Cc2.

[Embodiment 3]

Figure 5:
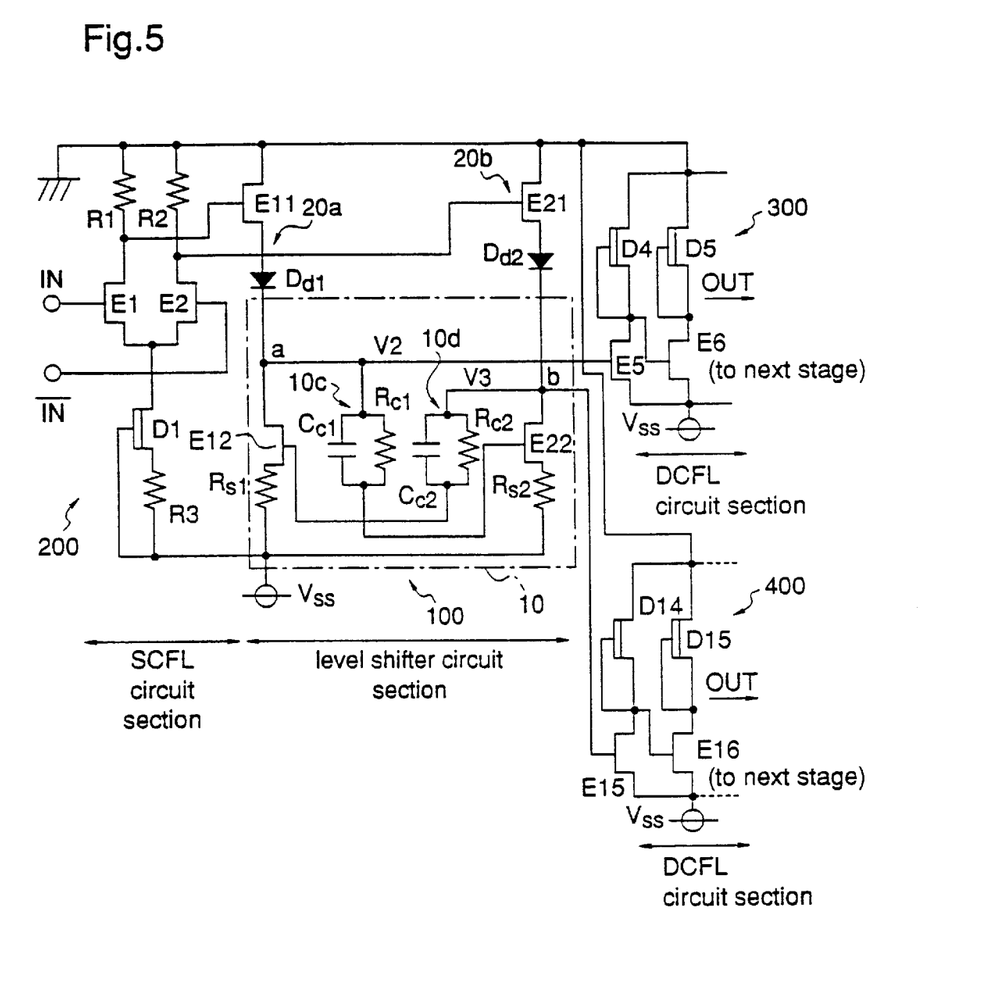
FIG. 5 illustrates an example of a level shift circuit according to a third embodiment of the present invention.

FIG. 5 is a diagram illustrating a level shift circuit according to a third embodiment of the present invention.

This circuit of the third embodiment has the configuration of the circuit shown in FIG. 1 from which the resistors Ra1 and Ra2 are removed. According to the third embodiment, the operating voltage range of the circuit is as small as 1 V, as described in the first embodiment. However, the number of components can be reduced according to the removed resistors Ra1 and Ra2, and this leads to a reduction in the chip area when the circuit of this embodiment is actually patterned as an IC. In addition, the absence of the resistors Ra1 and Ra2 results in a circuit appropriate for high-speed operation.

[Embodiment 4]

Figure 6:
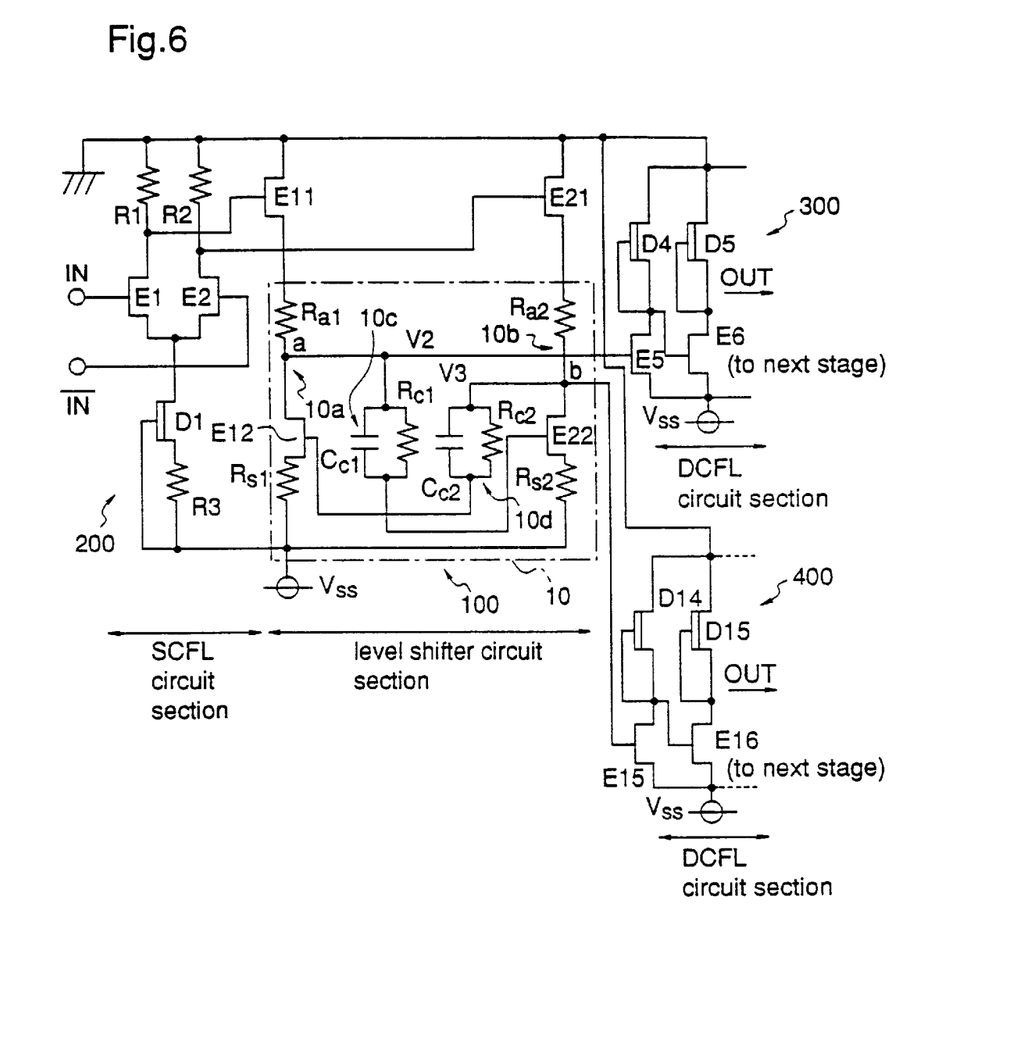
FIG. 6 shows an example of a level shift circuit according to a fourth embodiment of the present invention.

FIG. 6 is a diagram illustrating a level shift circuit according to a fourth embodiment of the present invention. The circuit of the fourth embodiment has the configuration of the circuit shown in FIG. 1 from which the diodes Dd1 and Dd2 are removed.

The circuit of the fourth embodiment is appropriate for low-voltage operation. This results because, when the supply voltage is low, the voltages applied to respective parts of the circuit are decreased, whereby the diodes Dd1 and Dd2 can be eliminated.

According to the fourth embodiment, the center voltage (optimal operating voltage), which is about 3 V in the circuit of the first embodiment, can be reduced to 2.4 V, shifting the operating voltage range shown in FIGS. 2 and 3 to the low voltage side. Therefore, it is possible to obtain a level shift circuit which is appropriate for operation in a low voltage range and provides the same effects as the first embodiment.

What is claimed is:

1. A level shift circuit shifting logic levels of an SCFL circuit to logic levels of a DCFL circuit comprising:

an SCFL circuit having two complementary outputs;

a DCFL type flip-flop circuit comprising two series circuits, each series circuit including a switching FET and a load resistor, two parallel circuits, each parallel circuit having a resistor and a capacitance, and two input/output nodes connected to connection nodes of the switching FETs and the load resistors in the two series circuits, wherein the two input/output nodes are cross-coupled to gates of the switching FETs of the two series circuits through the two parallel circuits;

two source follower circuits, each source follower circuit comprising an FET and a diode and having inputs connected to the complementary outputs of the SCFL circuit and outputs connected to the load resistors of the series circuits, the load resistors being connected to the switching FETs; and two DCFL circuits having inputs connected to the two input/output nodes and at least one output connected to a following stage DCFL circuit.

2. The level shift circuit as defined in claim 1 wherein the respective capacitances are removed from the two parallel circuits.

3. The level shift circuit as defined in claim 1 wherein the respective load resistors are removed from the two series circuits.

4. The level shift circuit as defined in claim 1 wherein the respective diodes are removed from the two source follower circuits.

5. A level shift circuit shifting logic levels of an SCFL circuit to logic levels of a DCFL circuit comprising:

an SCFL circuit having two complementary outputs;

two source follower circuits having inputs respectively connected to corresponding complementary outputs of the SCFL circuit;

a flip-flop circuit detecting "high" or "low" signals that have reached a DCFL level, through the two source follower circuits, and outputting output signals at two complementary outputs that have logic levels set in response to detection results produced by the flip-flop circuit; and DCFL circuits having respective inputs connected to corresponding outputs of the high/low detecting circuit.

6. The level shift circuit as defined in claim 5 wherein the flip-flop circuit comprises two series circuits, each series circuit including a switching FET and a load resistor, two parallel circuits, each parallel circuit having a resistor and a capacitor, and two input/output nodes connected to connection nodes of the switching FET's and the load resistors in the two series circuits, wherein the two input/output nodes are cross-coupled to gates of the switching FET's of the two series circuits through the two parallel circuits.

* * * * *